US009850697B2

(12) United States Patent
Kim et al.

(10) Patent No.: US 9,850,697 B2
(45) Date of Patent: Dec. 26, 2017

(54) SAFETY POWER WINDOW SYSTEM AND OPERATION METHOD THEREOF

(71) Applicant: HYUNDAI MOTOR COMPANY, Seoul (KR)

(72) Inventors: Young Suk Kim, Seoul (KR); Jung Min Lim, Gyeongju-si (KR); So Dam Jeong, Anyang-si (KR); Kyeong Won Jeon, Seoul (KR); Seung Ju Ham, Suwonsi (KR)

(73) Assignee: KOREA ELECTRICAL POWER CORPORATION, Naju-si, Jeollanam-do (KR)

( * ) Notice: Subject to any disclaimer, the term of this patent is extended or adjusted under 35 U.S.C. 154(b) by 20 days.

(21) Appl. No.: 15/188,524

(22) Filed: Jun. 21, 2016

(65) Prior Publication Data

US 2017/0159343 A1    Jun. 8, 2017

(30) Foreign Application Priority Data

Dec. 3, 2015 (KR) .................... 10-2015-0171714

(51) Int. Cl.
*E05F 15/40* (2015.01)
*B60J 1/08* (2006.01)
(Continued)

(52) U.S. Cl.
CPC ............ *E05F 15/41* (2015.01); *B60J 1/08* (2013.01); *E05F 15/689* (2015.01); *G01R 33/07* (2013.01);
(Continued)

(58) Field of Classification Search
USPC ............... 318/264–266, 272, 275, 277, 282, 318/430–434, 466–469, 626
See application file for complete search history.

(56) References Cited

U.S. PATENT DOCUMENTS 5,351,439 A * 10/1994 Takeda .................. G01L 5/0042
49/28
5,404,673 A * 4/1995 Takeda ................... B60J 7/0573
318/266

(Continued)

FOREIGN PATENT DOCUMENTS

JP    2001040935 A    2/2001
JP    2010519443 A    6/2010
(Continued)

OTHER PUBLICATIONS

Office Action Korean Patent Application No. 10-2015-0171714 dated Jan. 11, 2017.
(Continued)

*Primary Examiner* — Bentsu Ro
(74) *Attorney, Agent, or Firm* — McDermott Will & Emery LLP

(57) ABSTRACT

The present disclosure relates to a safety power window system capable of detecting jamming of an object between a window and a door frame by generating virtual pulse signals on the basis of pulse signals generated by two hall sensors positioned to have an interval of 90 degrees therebetween to calculate force acting on the window even though a window motor rotates only 0.75 turns, and an operation method thereof.

16 Claims, 4 Drawing Sheets

(51) Int. Cl.
   *G01R 33/07*      (2006.01)
   *E05F 15/41*      (2015.01)
   *E05F 15/689*     (2015.01)
(52) U.S. Cl.
   CPC ....... *E05Y 2400/30* (2013.01); *E05Y 2400/44* (2013.01); *E05Y 2900/55* (2013.01)

(56) References Cited

U.S. PATENT DOCUMENTS

| | | | |
|---|---|---|---|
| 6,201,389 B1 * | 3/2001 | Apel | G01D 5/145 324/207.2 |
| 6,646,398 B1 * | 11/2003 | Fukazawa | H02H 7/0851 318/264 |
| 7,095,200 B2 * | 8/2006 | Shinohara | H02H 7/0851 318/286 |
| 2015/0247351 A1 | 9/2015 | Son et al. | |

FOREIGN PATENT DOCUMENTS

| | | |
|---|---|---|
| JP | 2011-132686 A | 7/2011 |
| JP | 2013-007671 A | 1/2013 |
| KR | 2001-0001049 A | 1/2001 |
| KR | 1020060070088 A | 6/2006 |
| KR | 10-2009-0025993 A | 3/2009 |
| KR | 100897348 B1 | 5/2009 |
| KR | 100902157 B1 | 6/2009 |
| KR | 1020100063169 A | 6/2010 |
| KR | 1020100070416 A | 6/2010 |
| KR | 101261043 B1 | 5/2013 |
| KR | 1020130067447 A | 6/2013 |
| KR | 1020140100276 A | 8/2014 |
| KR | 101462112 B1 | 11/2014 |
| KR | 101511591 B1 | 4/2015 |

OTHER PUBLICATIONS

Korean Office Action dated Jul. 20, 2017 issued in Korean Patent Application No. 10-2015-0171714.

* cited by examiner

SAFETY POWER WINDOW SYSTEM AND OPERATION METHOD THEREOF

CROSS-REFERENCE TO RELATED APPLICATION

This application is based on and claims the benefit of priority to Korean Patent Application No. 10-2015-0171714, filed on Dec. 3, 2015 in the Korean Intellectual Property Office, the disclosure of which is incorporated herein in its entirety by reference.

TECHNICAL FIELD

The present disclosure relates to a safety power window system and an operation method thereof, and more particularly, to a technology capable of detecting jamming of an object between a window and a door frame by calculating force acting on the window using two hall sensors even in a situation in which a window motor may not rotate once or more.

BACKGROUND

Generally, a power window system includes a button for receiving a window opening or closing signal and a window motor for opening or closing a window in each door of a vehicle in response to the signal to allow a driver to easily open and close the widow.

Particularly, the power window system may include an automatic up/down button to completely open or close the window by one-time manipulation by the driver.

Recently, a case in which a finger of a child is jammed and injured in a space between the window and a door frame during a rise of the window by the automatic up button has often occurred.

In order to solve this problem, a power window system (hereinafter, referred to as a safety power window system) having a jamming prevention function of preventing an injury to a human body by lowering the window through reverse rotation of the window motor when jamming of an object during the rise of the window is sensed has been developed.

A safety power window system according to the related art calculates force acting on the window using a pulse waveform generated by a hall sensor depending on a polarity of a corresponding magnet at the time of rotation of a motor rotor, and determines that the object is jammed between the window and the door frame to lower the window when the calculated force exceeds a threshold value.

In the safety power window system according to the related art, a safety power window function is implemented using a single hall sensor. Therefore, only in the case in which the number of pulse waveforms generated by the hall sensor is two or more, that is, corresponding to the case in which the window motor rotates twice or more, an acceleration of the window motor may be calculated, and force acting on the window may be calculated through the acceleration.

In another safety power window system according to the related art, the safety power window function is implemented using two hall sensors positioned to have an interval of 90 degrees therebetween. Therefore, only in the case in which the window motor rotates 1.5 turns or more, the acceleration of the window motor may be calculated, and force acting on the window may be calculated through the acceleration.

As a result, in the safety power window systems according to the related art, force acting on the window may not be calculated in an extreme situation in which the window motor may not rotate once or more. Therefore, the safety power window systems according to the related art may not detect the jamming of the object between the window and the door frame.

SUMMARY

The present disclosure has been made to solve the above-mentioned problems occurring in the prior art while advantages achieved by the prior art are maintained intact.

An aspect of the present disclosure provides a safety power window system capable of detecting jamming of an object between a window and a door frame by generating virtual pulse signals on the basis of pulse signals generated by two hall sensors positioned to have an interval of 90 degrees therebetween to calculate force acting on the window even though a window motor rotates only 0.75 turns, and an operation method thereof.

Objects of the present disclosure are not limited to the above-mentioned object, and other objects and advantages of the present disclosure that are not mentioned may be understood by the following description and will be more clearly appreciated by exemplary embodiments of the present disclosure. In addition, it may be easily appreciated that objects and advantages of the present disclosure may be realized by means mentioned in the claims and a combination thereof.

According to an exemplary embodiment of the present disclosure, a safety power window system includes: a first hall sensor positioned at a rotation start point of a window motor and configured to generate a first pulse signal depending on rotation of the window motor; a second hall sensor positioned to be spaced apart from the first hall sensor by an interval of 90 degrees and configured to generate a second pulse signal depending on the rotation of the window motor; and a controller configured to generate a first virtual pulse signal and a second virtual pulse signal on the basis of the first pulse signal and the second pulse signal at the time of a rise of a window, calculate force acting on the window on the basis of the first and second pulse signals and the first and second virtual pulse signals, and determine that an object is jammed between the window and a door frame to lower the window, in the case in which the calculated force exceeds a threshold value.

According to another exemplary embodiment of the present disclosure, an operation method of a safety power window system includes: generating a first pulse signal depending on rotation of a window motor, by a first hall sensor positioned at a rotation start point of the window motor; generating a second pulse signal depending on the rotation of the window motor, by a second hall sensor positioned to be spaced apart from the first hall sensor, an angle between a line connecting a rotation axis of the window motor and the first hall sensor and a line connecting the rotation axis of the window motor and the second hall sensor being 90 degrees; generating a first virtual pulse signal and a second virtual pulse signal on the basis of the first pulse signal and the second pulse signal at the time of a rise of a window, by a controller; calculating an acceleration of the window motor using the first and second pulse signals and the first and second virtual pulse signals; calculating force acting on the window on the basis of the acceleration; and determining that an object is jammed between the window and a door frame to lower the window, in the case in which the calculated force exceeds a threshold value.

BRIEF DESCRIPTION OF THE DRAWINGS

The above and other objects, features and advantages of the present disclosure will be more apparent from the following detailed description taken in conjunction with the accompanying drawings.

DETAILED DESCRIPTION

The above-mentioned objects, features, and advantages will become more obvious from the following description described below in detail with reference to the accompanying drawings. Therefore, those skilled in the art to which the present disclosure pertains may easily practice a technical idea of the present disclosure. Further, in describing the present disclosure, in the case in which it is decided that a detailed description of a well-known technology associated with the present disclosure may unnecessarily make the gist of the present disclosure unclear, it will be omitted. Hereinafter, exemplary embodiments of the present disclosure will be described in detail with reference to the accompanying drawings.

Figure 1:
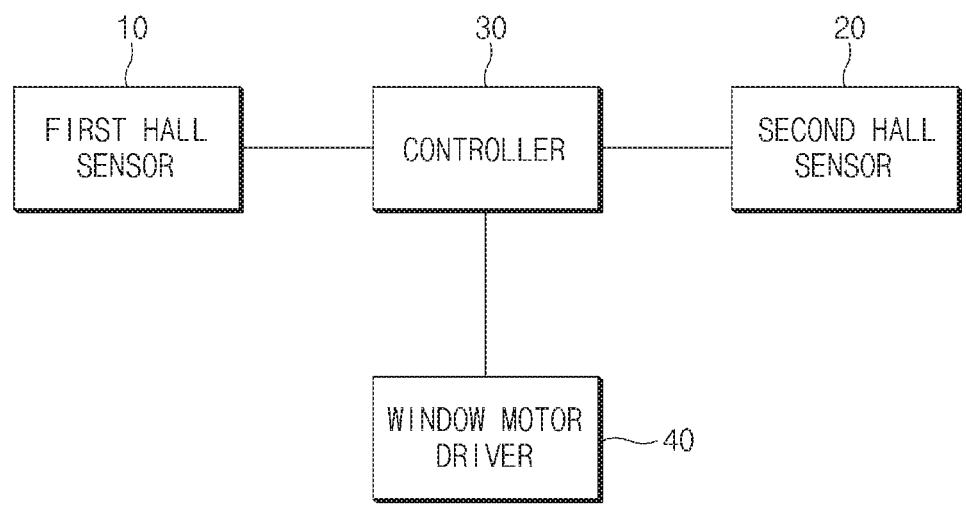
FIG. 1 is a block diagram of a safety power window system according to an exemplary embodiment of the present disclosure.

FIG. 1 is a block diagram of a safety power window system according to an exemplary embodiment of the present disclosure.

As illustrated in FIG. 1, the safety power window system according to an exemplary embodiment of the present disclosure includes a first hall sensor 10, a second hall sensor 20, a controller 30, and a window motor driver 40.

The respective components will be described. The first hall sensor 10 is positioned at a rotation start point of a window motor, and generates a first pulse signal depending on rotation of the window motor.

The second hall sensor 20 is positioned to be spaced apart from the first hall sensor 10 by an interval of 90 degrees (that is, an angle between a line connecting a rotation axis of the window motor and the first hall sensor 10 and a line connecting the rotation axis of the window motor and the second hall sensor 20 is 90 degrees), and generates a second pulse signal depending on the rotation of the window motor.

Hereinafter, positions of the first hall sensor 10 and the second hall sensor 20 will be described in detail with reference to FIG. 2.

Figure 2:
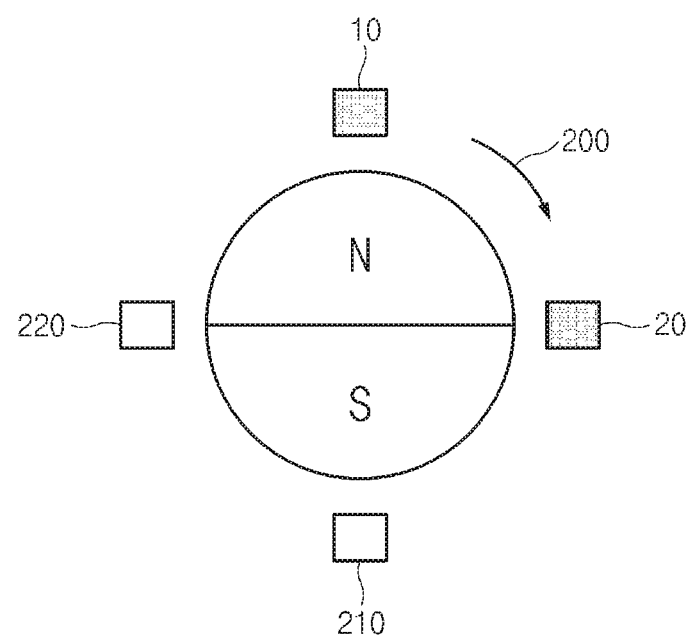
FIG. 2 is a schematic view illustrating positions of two hall sensors according to an exemplary embodiment of the present disclosure.

FIG. 2 is a schematic view illustrating positions of two hall sensors according to an exemplary embodiment of the present disclosure.

In FIG. 2, the first hall sensor 10 is positioned at a rotation start point (12 o'clock position) of the window motor, and the second hall sensor 20 is positioned at a point (3 o'clock position) having an interval of 90 degrees from the first hall sensor 10 and generates the pulse signals corresponding to the rotation of the window motor. Here, a reference numeral '200' indicates a rotation direction of the window motor.

In addition, a reference numeral '210' indicates a point corresponding to a first virtual pulse signal generated by the controller 30, and a reference numeral '220' indicates a point corresponding to a second virtual pulse signal generated by the controller 30.

Further, a reference sign 'N' means the North Pole, and a reference sign 'S' means the South Pole.

The controller 30 performs a general control so that the respective components described above may normally perform their functions.

Particularly, the controller 30 controls the window motor driver 40 to raise a window until the window is completely closed, when it receives a rise command of the window through an automatic up button. The controller 30 also controls the window motor driver 40 to raise the window until the window is completely closed during a period in which a manual up button is operated by a driver.

Here, the controller 30 periodically generates a first virtual pulse signal and a second virtual pulse signal on the basis of the first pulse signal generated by the first hall sensor 10 and the second pulse signal generated by the second hall sensor 20. Here, a process of generating the virtual pulse signals may be performed from a point in time in which the window rises or may be performed from a point in time in which the window rises to a reference height or more (just before the window is completely closed). As an example, a term 'just before the window is completely closed' means a state in which the window is opened by 5 to 10 mm from the door frame.

In addition, the controller 30 detects an acceleration of a motor using the first and second pulse signals and the first and second virtual pulse signals, calculates an acceleration of the window motor and force acting on the window on the basis of the acceleration of the motor. Here, force (F) is represented by the product of a mass (m) and an acceleration (a), and since the mass is a set value (a constant), the force may be calculated when only the acceleration is recognized.

In addition, the controller 30 determines whether or not the force acting on the window exceeds a threshold value, and determines that an object is jammed between the window and a door frame to control the window motor driver 40 to lower the window, when the force acting on the window exceeds the threshold value. The controller 30 controls the window motor driver 40 to raise the window until the window is completely closed when the force acting on the window does not exceed the threshold value. Here, the controller 30 may lower the window up to a set position or completely lower the window.

Hereinafter, a process in which the controller 30 generates a first virtual pulse signal 350 and a second virtual pulse signal 360 will be described in detail with reference to FIG. 3.

Figure 3:
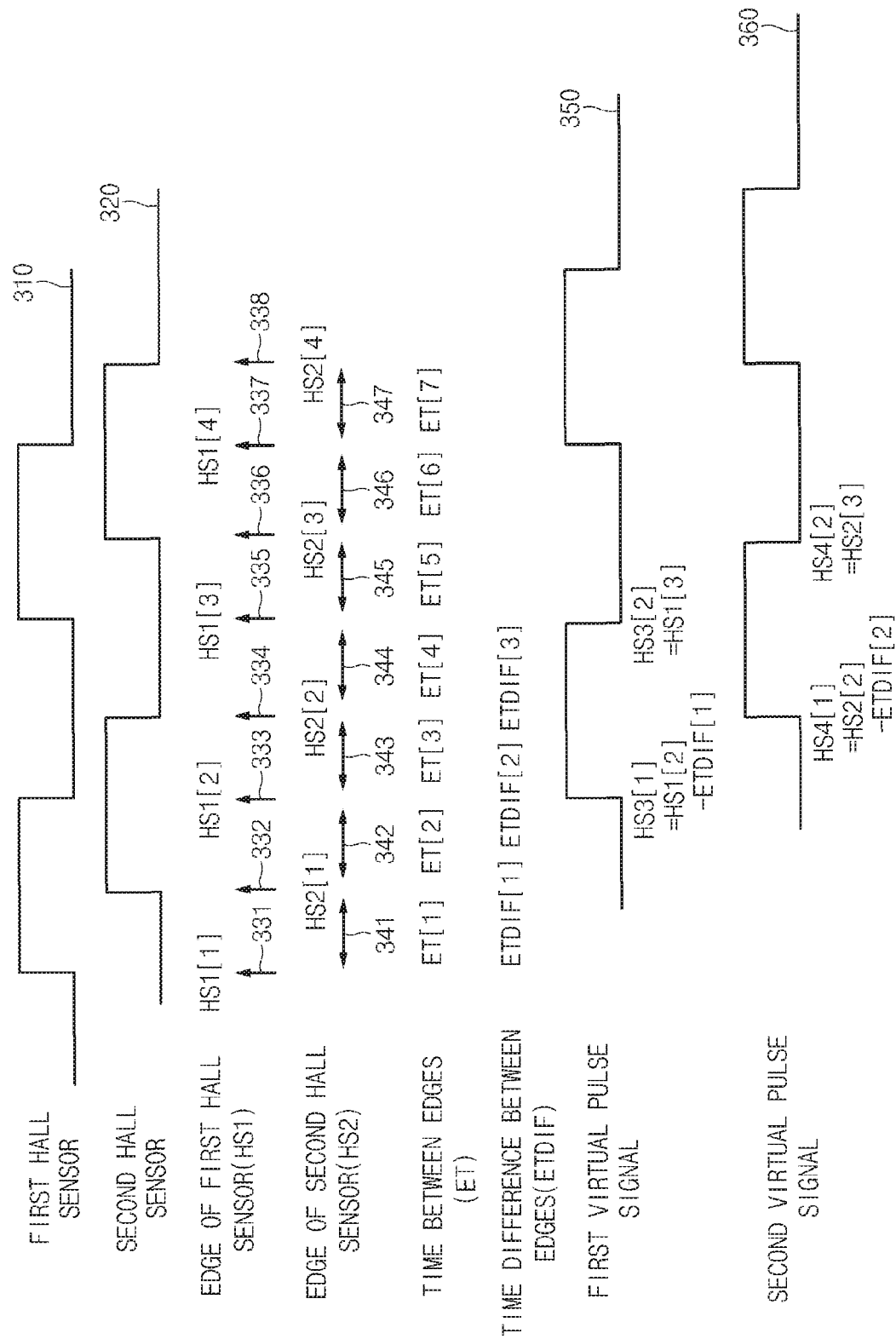
FIG. 3 is a schematic view illustrating a first virtual pulse signal and a second virtual pulse signal according to an exemplary embodiment of the present disclosure.

FIG. 3 is a schematic view illustrating a first virtual pulse signal and a second virtual pulse signal according to an exemplary embodiment of the present disclosure.

In FIG. 3, a reference numeral '310' means the first pulse signal generated by the first hall sensor 10, and a reference numeral '320' means the second pulse signal generated by the second hall sensor 20.

In addition, a reference numeral '331', which is a first edge of the first pulse signal 310, is represented by HS1[1], a reference numeral '332', which is a first edge of the second pulse signal 320, is represented by HS2[1], a reference numeral '333', which is a second edge of the first pulse signal 310, is represented by HS1[2], a reference numeral '334', which is a second edge of the second pulse signal 320, is represented by HS2[2], a reference numeral '335', which is a third edge of the first pulse signal 310, is represented by HS1[3], a reference numeral '336', which is a third edge of the second pulse signal 320, is represented by HS2[3], a reference numeral '337', which is a fourth edge of the first pulse signal 310, is represented by HS1[4], and a reference numeral '338', which is a fourth edge of the second pulse signal 320, is represented by HS2[4].

In addition, a reference numeral '341' is a time between HS1[1] and HS2[1] and an Equation: ET[1]=HS2[1]−HS1[1] is satisfied, a reference numeral '342' is a time between HS2[1] and HS1[2] and an Equation: ET[2]=HS1[2]−HS2[1] is satisfied, a reference numeral '343' is a time between HS1[2] and HS2[2] and an Equation: ET[3]=HS2[2]−HS2[2] is satisfied, a reference numeral '344' is a time between HS2[2] and HS1[3] and an Equation: ET[4]=HS1[3]−HS2[2] is satisfied, a reference numeral '345' is a time between HS1[3] and HS2[3] and an Equation: ET[5]=HS2[3]−HS1[3] is satisfied, a reference numeral '346' is a time between HS2[3] and HS1[4] and an Equation: ET[6]=HS1[4]−HS2[3] is satisfied, and a reference numeral '347' is a time between HS1[4] and HS2[4] and an Equation: ET[7]=HS2[4]−HS1[4] is satisfied.

Further, ETDIF[1] indicating a time difference between ET[1] 341 and ET[2] 342 satisfies Equation: ETDIF[1]=ET[2]−ET[1], ETDIF[2] indicating a time difference between ET[2] 342 and ET[3] 343 satisfies Equation: ETDIF[2]=ET[3]−ET[2], and ETDIF[3] indicating a time difference between ET[3] 343 and ET[4] 344 satisfies Equation: ETDIF[3]=ET[4]−ET[3].

Meanwhile, the controller 30 calculates an initial edge HS3[1] of the first virtual pulse signal 350 from a relationship between the first pulse signal 310 and the second pulse signal 320. That is, the initial edge of the first virtual pulse signal 350 is calculated using the following Equation 1.

$$HS3[1]=HS1[2]-ETDIF[1]=(2 \times HS2[1])-HS1[1] \quad \text{[Equation 1]}$$

Then, a second edge HS3[2] of the first virtual pulse signal 350 is synchronized with HS1[3].

In addition, the controller 30 calculates an initial edge HS4[1] of the second virtual pulse signal 360 from a relationship between the first pulse signal 310 and the second pulse signal 320. That is, the initial edge of the second virtual pulse signal 360 is calculated using the following Equation 2.

$$HS4[1]=HS2[2]-ETDIF[2]=(2 \times HS1[2])-HS2[1] \quad \text{[Equation 2]}$$

Then, a second edge HS4[2] of the second virtual pulse signal 360 is synchronized with HS2[3].

Figure 4:
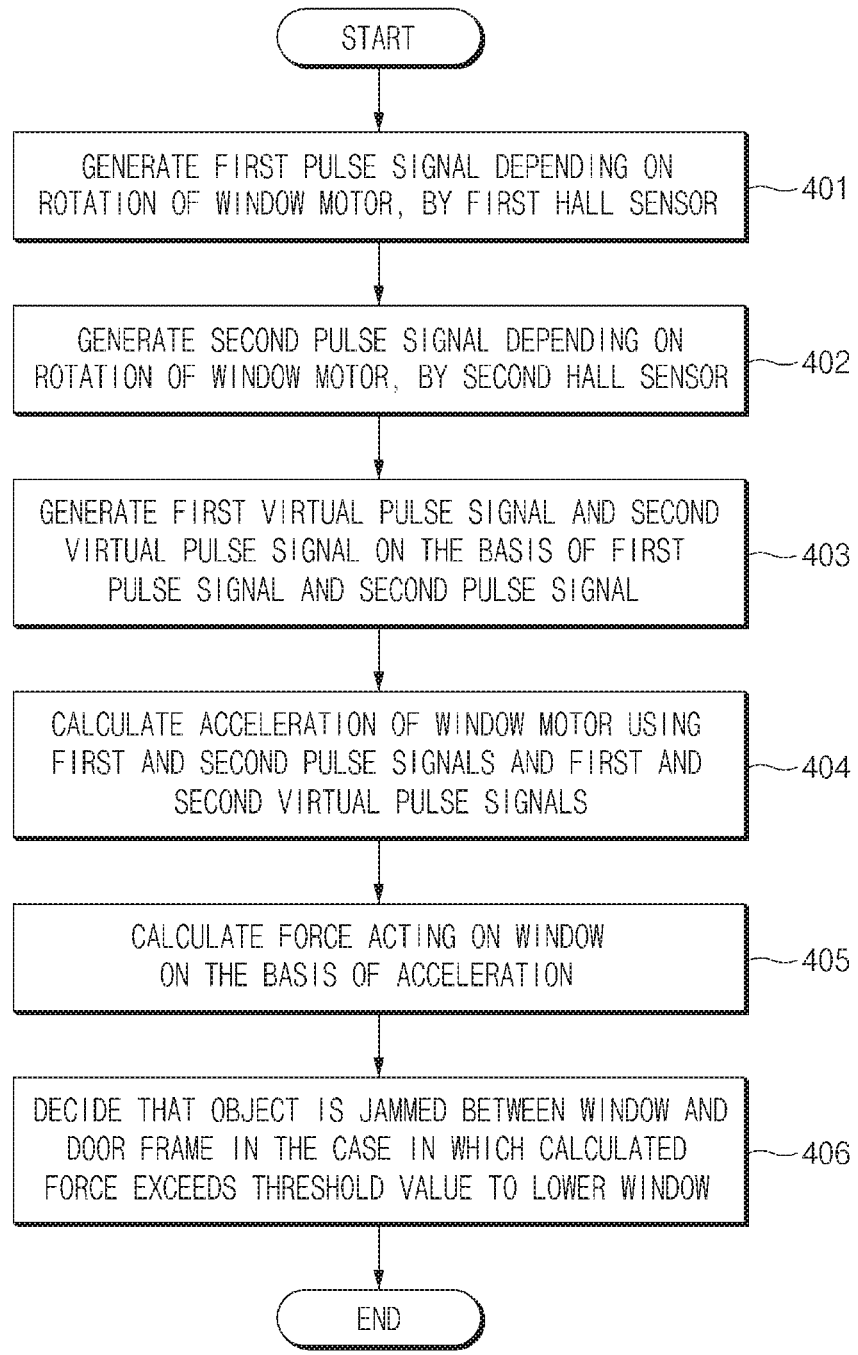
FIG. 4 is a flow chart illustrating an operation method of a safety power window system according to an exemplary embodiment of the present disclosure.

FIG. 4 is a flow chart illustrating an operation method of a safety power window system according to an exemplary embodiment of the present disclosure.

First, the first hall sensor 10 positioned at the rotation start point of the window motor generates the first pulse signal depending on the rotation of the window motor (401).

Then, the second hall sensor 20 positioned to be spaced apart from the first hall sensor 10 by an interval of 90 degrees generates the second pulse signal depending on the rotation of the window motor (402).

Then, the controller 30 generates the first virtual pulse signal and the second virtual pulse signal on the basis of the first pulse signal and the second pulse signal at the time of a rise of the window (403).

Then, the controller 30 calculates the acceleration of the window motor using the first and second pulse signals and the first and second virtual pulse signals (404).

Then, the controller 30 calculates the force acting on the window on the basis of the acceleration.

Then, the controller 30 determines that the object is jammed between the window and the door frame to lower the window (406), in the case in which the calculated force exceeds the threshold value.

Through the process described above, even though the window motor rotates only 0.75 turns, the force acting on the window may be calculated, thereby making it possible to detect the jamming of the object between the window and the door frame.

Meanwhile, the operation method of a safety power window system according to an exemplary embodiment of the present disclosure as described above may be created by a computer program. In addition, codes and code segments configuring the computer program may be easily inferred by a computer programmer skilled in the related art. Further, the created computer program is stored in a computer-readable recording medium (information storing medium) and is read and executed by a computer to implement the operation method of a safety power window system according to an exemplary embodiment of the present disclosure. Further, the computer-readable recording medium includes all types of recording media that are readable by the computer.

As described above, according to the exemplary embodiment of the present disclosure, the virtual pulse signals are generated on the basis of the pulse signals generated by the two hall sensors positioned to have the interval of 90 degrees therebetween, thereby making it possible to calculate the force acting on the window even though the window motor rotates only 0.75 turns.

In addition, even though the window motor rotates only 0.75 turns, the force acting on the window may be calculated, thereby making it possible to detect the jamming of the object between the window and the door frame.

Hereinabove, although the present disclosure has been described with reference to exemplary embodiments and the accompanying drawings, the present disclosure is not limited thereto, but may be variously modified and altered by those skilled in the art to which the present disclosure pertains without departing from the spirit and scope of the present disclosure claimed in the following claims.

What is claimed is:

1. A safety power window system comprising:
   a first hall sensor positioned at a rotation start point of a window motor and configured to generate a first pulse signal depending on rotation of the window motor;
   a second hall sensor configured to generate a second pulse signal depending on the rotation of the window motor; and
   a controller configured to generate a first virtual pulse signal and a second virtual pulse signal on the basis of the first pulse signal and the second pulse signal at the time of a rise of a window, calculate force acting on the window on the basis of the first and second pulse signals and the first and second virtual pulse signals, and determine that an object is jammed between the window and a door frame in the case in which the calculated force exceeds a threshold value.

2. The safety power window system according to claim 1, wherein the second hall sensor is positioned to be spaced apart from the first hall sensor, and an angle between a line connecting a rotation axis of the window motor and the first hall sensor and a line connecting the rotation axis of the window motor and the second hall sensor is 90 degrees.

3. The safety power window system according to claim 2, wherein the controller generates the first virtual pulse signal at a point in time in which the window motor rotates 0.5 turns.

4. The safety power window system according to claim 2, wherein the controller generates the second virtual pulse signal at a point in time in which the window motor rotates 0.75 turns.

5. The safety power window system according to claim 1, wherein the controller generates the first virtual pulse signal and the second virtual pulse signal from a point in time in which the window rises to a reference height or more.

6. The safety power window system according to claim 1, wherein the controller calculates an acceleration of the window motor using the first and second pulse signals and the first and second virtual pulse signals and calculates the force acting on the window on the basis of the acceleration.

7. The safety power window system according to claim 1, wherein the controller lowers the window in the case in which the controller determines that the object is jammed between the window and the door frame.

8. The safety power window system according to claim 7, wherein the controller completely lowers the window in the case in which the controller determines that the object is jammed between the window and the door frame.

9. The safety power window system according to claim 7, wherein the controller lowers the window up to a set position in the case in which the controller determines that the object is jammed between the window and the door frame.

10. An operation method of a safety power window system, comprising:
 generating a first pulse signal depending on rotation of a window motor, by a first hall sensor positioned at a rotation start point of the window motor;
 generating a second pulse signal depending on the rotation of the window motor, by a second hall sensor positioned to be spaced apart from the first hall sensor, an angle between a line connecting a rotation axis of the window motor and the first hall sensor and a line connecting the rotation axis of the window motor and the second hall sensor being 90 degrees;
 generating a first virtual pulse signal and a second virtual pulse signal on the basis of the first pulse signal and the second pulse signal at the time of a rise of a window, by a controller;
 calculating an acceleration of the window motor using the first and second pulse signals and the first and second virtual pulse signals;
 calculating force acting on the window on the basis of the acceleration; and
 determining that an object is jammed between the window and a door frame in the case in which the calculated force exceeds a threshold value.

11. The operation method of a safety power window system according to claim 10, wherein in the generating of the first virtual pulse signal, the first virtual pulse signal is generated at a point in time in which the window motor rotates 0.5 turns.

12. The operation method of a safety power window system according to claim 10, wherein in the generating of the second virtual pulse signal, the second virtual pulse signal is generated at a point in time in which the window motor rotates 0.75 turns.

13. The operation method of a safety power window system according to claim 10, wherein in the generating of the first virtual pulse signal and the second virtual pulse signal, the first virtual pulse signal and the second virtual pulse signal are generated from a point in time in which the window rises to a reference height or more.

14. The operation method of a safety power window system according to claim 10, further comprising lowering the window in the case in which the controller determines that the object is jammed between the window and the door frame.

15. The operation method of a safety power window system according to claim 14, wherein in the lowering of the window, the window is completely lowered in the case in which the controller determines that the object is jammed between the window and the door frame.

16. The operation method of a safety power window system according to claim 14, wherein in the lowering of the window, the window is lowered up to a set position in the case in which the controller determines that the object is jammed between the window and the door frame.

* * * * *

UNITED STATES PATENT AND TRADEMARK OFFICE
CERTIFICATE OF CORRECTION

PATENT NO. : 9,850,697 B2  
APPLICATION NO. : 15/188524  
DATED : December 26, 2017  
INVENTOR(S) : Young Suk Kim et al.

Page 1 of 1

It is certified that error appears in the above-identified patent and that said Letters Patent is hereby corrected as shown below:

On the Title Page

(73) Assignee:
"KOREA ELECTRICAL POWER CORPORATION, Naju-si, Jeollanam-do (KR)"
Should read:
--HYUNDAI MOTOR COMPANY, Seoul (KR)--.

Signed and Sealed this  
Ninth Day of July, 2019

Andrei Iancu  
*Director of the United States Patent and Trademark Office*